(12) United States Patent
Giaccio et al.

(10) Patent No.: US 11,573,702 B2
(45) Date of Patent: *Feb. 7, 2023

(54) HOST CLOCK EFFECTIVE DELAY RANGE EXTENSION

(71) Applicant: Micron Technology, Inc., Boise, ID (US)

(72) Inventors: Claudio Giaccio, Torre del Greco (IT); Erminio Di Martino, Quarto (IT); Jeffery Carlos Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/331,281

(22) Filed: May 26, 2021

(65) Prior Publication Data

US 2021/0286516 A1 Sep. 16, 2021

Related U.S. Application Data

(63) Continuation of application No. 16/219,218, filed on Dec. 13, 2018, now Pat. No. 11,042,301.

(51) Int. Cl.
*G06F 1/12* (2006.01)
*G06F 1/04* (2006.01)
*G06F 3/06* (2006.01)
*G06F 11/10* (2006.01)

(52) U.S. Cl.
CPC ............ *G06F 3/061* (2013.01); *G06F 3/0634* (2013.01); *G06F 3/0659* (2013.01); *G06F 3/0679* (2013.01); *G06F 11/1072* (2013.01)

(58) Field of Classification Search
CPC ........ G06F 3/061; G06F 3/634; G06F 3/0659; G06F 3/0679; G06F 11/072; G06F 11/14; G11C 29/022; G11C 29/028; G11C 29/56012; G11C 29/023; G11C 16/32
See application file for complete search history.

(56) References Cited

U.S. PATENT DOCUMENTS

| | | | |
|---|---|---|---|
| 9,800,400 | B1 | 10/2017 | Stoier |
| 9,811,273 | B1 | 11/2017 | Brahmadathan |
| 2003/0154416 | A1 | 8/2003 | Laberge |
| 2008/0098142 | A1 | 4/2008 | Fujimoto |
| 2014/0082397 | A1 | 3/2014 | Shin et al. |
| 2020/0192570 | A1 | 6/2020 | Giaccio et al. |

*Primary Examiner* — Nitin C Patel
(74) *Attorney, Agent, or Firm* — Schwegman Lundberg & Woessner, P.A.

(57) ABSTRACT

Devices and techniques are disclosed herein to extend a range of an effective delay of a delay circuit having a configurable delay limited to a first range of delay values with respect to a first edge of a clock signal. A selection circuit can selectively apply the configurable delay to a subsequent, second edge of the clock signal to extend the range of the effective delay of the delay circuit beyond the first range of delay values.

20 Claims, 8 Drawing Sheets

US 11,573,702 B2

HOST CLOCK EFFECTIVE DELAY RANGE EXTENSION

CLAIM OF PRIORITY

This application is a continuation of and claims priority to U.S. application Ser. No. 16/219,218, filed Dec. 13, 2018, issued as U.S. Pat. No. 11,042,301, on Jun. 22, 2021, which is herein incorporated by reference in its entirety.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), a Universal Flash Storage (UFS™) device, a MultiMediaCard (MMC) solid-state storage device, an embedded MMC device (eMMC), etc., can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host, erase operations to erase data from the memory devices, perform drive management operations (e.g., data migration, garbage collection, block retirement), etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
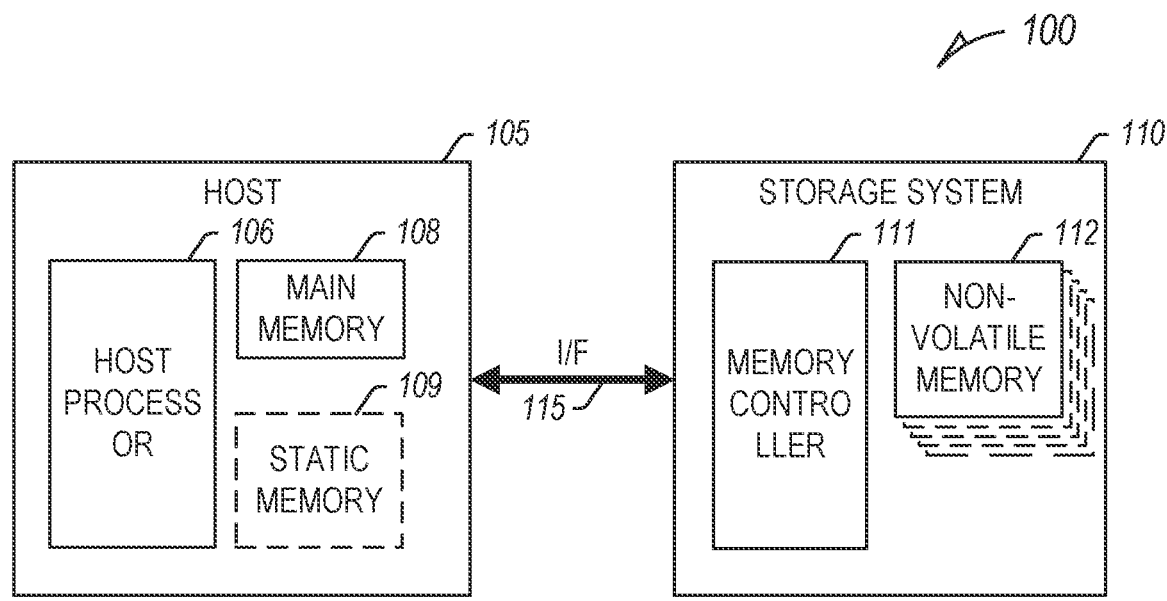
FIG. 1 illustrates an example host system including a host and a storage system.

Software (e.g., programs), instructions, operating systems (OS), and other data are typically stored on storage systems and accessed by main memory for use by a host processor. Main memory (e.g., RAM) is typically faster, more expensive, and a different type of memory device (e.g., volatile) than a majority of the memory of the storage systems (e.g., non-volatile, such as an SSD, a UFS, an eMMC, etc.). In addition to the main memory, host systems can include different levels of volatile memory, such as a group of static memory (e.g., a cache, often SRAM), often faster than the main memory, in certain examples configured to operate at speeds close to or exceeding the speed of the host processor, but with lower density and higher cost than the main memory. In other examples, more or less levels or quantities of main memory or static memory can be used, depending on desired host system performance, size, complexity, or cost.

A propagation delay between a host system and a storage system can depend on, among other things, operating conditions (e.g., temperature changes, supply voltage levels, etc.), in certain examples even changing within or during a single operation (e.g., an extended read operation, etc.). Testing can be performed to calibrate communication between a host system and a storage system across various operating conditions, such as to set an effective sampling delay to optimize sampling of data from storage system by the host system (e.g., avoiding sampling during data transitions). In certain examples, testing can be performed on one or more data lines of a communication interface between the host and storage systems, or one or more other lines of a communication interface (e.g., command lines, clock lines, data strobe lines, etc.).

Host systems or storage systems can include delay elements (e.g., one or more delay circuits, etc.) configured to help align data for sampling. The delay elements can provide a configurable delay on one or more lines of a communication interface, information being communicated between a host system and a storage system, or one or more internal or received clocks (e.g., a data strobe signal, a sampling clock, an internal clock, etc.). However, delay elements often have a limited amount of configurable delay. In certain technologies (e.g., field programmable gate arrays (FPGA), etc.), the amount of delay is finite for a given size or cost. The present inventors have recognized, among other things, systems and methods to calibrate delay elements (e.g., select a configurable delay and a clock edge, etc.), in certain examples, to increase the effective calibration range, and accordingly, an effective delay of delay elements.

In certain examples, bit slip can refer to a phenomenon where the configurable delay of a host, or storage system is not enough to align data to be correctly sampled at the active edge of the sampling clock. In such examples, an input stage (e.g., an input stage circuit), or one or more other circuits, can be used to configure data for sampling using a subsequent clock edge (e.g., if the active edge of the sampling clock is a rising edge, using the subsequent falling edge, or the subsequent rising edge, etc.) either alone or, in certain examples, in combination with the delay elements to optimize alignment of data for sampling.

FIG. 1 illustrates an example system (e.g., a host system) 100 including a host 105 and a storage system 110 configured to communicate over a communication interface (I/F) 115 (e.g., a bidirectional parallel or serial communication interface). The host 105 can include a host processor 106 (e.g., a host central processing unit (CPU) or other processor or processing device) or other host circuitry (e.g., a memory management unit (MMU), interface circuitry, assessment circuitry 107, etc.). In certain examples, the host 105 can include a main memory 108 (e.g., DRAM, etc.) and optionally, a static memory 109, to support operation of the host processor 106.

The storage system 110 can include a solid-state drive (SSD), a universal flash storage (UFS) device, an embedded MMC (eMMC) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host 105 and the storage system 110.

The storage system 110 can include a memory controller 111 and a non-volatile memory 112. In an example, the non-volatile memory 112 can include a number of memory devices (e.g., dies or LUNs), such as one or more flash memory devices, etc., each including periphery circuitry thereon, and controlled by the memory controller 111. Flash memory devices typically include one or more groups of one-transistor, floating gate memory cells. Two common types of flash memory array architectures include NAND and NOR architectures. Memory cells in the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

In three-dimensional (3D) architecture semiconductor memory device technology, vertical floating gate or charge trapping storage structures can be stacked, increasing the number of tiers, physical pages, and accordingly, the density of memory cells in a memory device. Each memory cell in a NOR, NAND, 3D Cross Point, Holographic RAM (HRAM), MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc.

The non-volatile memory 112 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1424 pages per block, 548 blocks per plane, and 4 planes per device, but with half the required write time and twice the program/erase (P/E) cycles as a corresponding TLC memory device. Other examples can include other numbers or arrangements.

The memory controller 111 can receive instructions from the host 105, and can communicate with the non-volatile memory 112, such as to transfer data to (e.g., write or erase) or from (e.g., read) one or more of the memory cells of the non-volatile memory 112. The memory controller 111 can include, among other things, an application specific integrated circuit (ASIC), a field programmable gate array (FPGA), or one or more other processing circuits or firmware, such as a number of components or integrated circuits. For example, the memory controller 111 can include one or more memory control units, circuits, or components configured to control access across the memory array and to provide a translation layer between the host 105 and the storage system 110.

In operation, in the example of NAND-based storage, data is typically written to or read from the storage system 110 in "pages" and erased in "blocks." However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size the NAND memory device is typically referred to as a page, whereas the data transfer size of a host is typically referred to as a sector. Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32B, 54B, 224B, etc.) of metadata corresponding to the user data, such as integrity data (e.g., error detecting or correcting code data), address data (e.g., logical address data, etc.), or other metadata associated with the user data.

Different types of memory cells or memory arrays can provide different size units in which data may be read, written, and erased, and in certain examples may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, an MLC NAND flash device may have a higher bit error rate than a corresponding SLC NAND flash device. As such, the MLC device may require more metadata bytes for error data than the corresponding SLC device.

Figure 2:
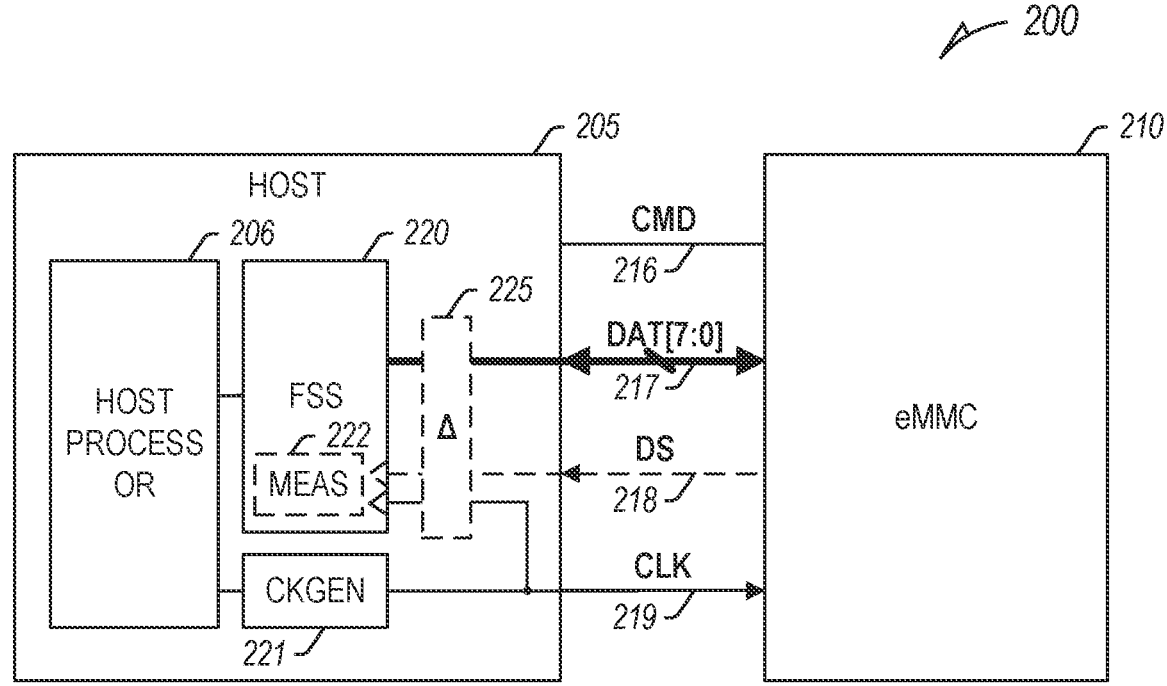
FIG. 2 illustrates an example embedded MultiMediaCard (eMMC) systems, or portions of eMMC systems, including a host, an eMMC device, and a communication interface.

FIG. 2 illustrates an example system (e.g., a host system) 200 including a host 205 and an eMMC 210 configured to communicate over a communication interface including one or more bidirectional command and data lines (e.g., a command line (CMD) 216, data lines (DAT[7:0]) 217, etc.). To synchronize communication of data between the eMMC 210 and the host 205 (e.g., over the eight parallel data lines 217 illustrated in FIG. 2, etc.), such as due to propagation delay between the host 205 and the eMMC 210, etc., the host 205 can provide a clock signal to the eMMC 210, for example, using a clock generator circuit 221 and a clock line (CLK) 219. In other examples, the communication interface can include one or more other lines (not shown), such as a reset line (RESET), power/voltage lines (e.g., VCC, VSS, etc.), etc.

Each of the host 205 and the eMMC 210 can include a number of receiver or driver circuits configured to send or receive signals over the communication interface (e.g., command, data, or one or more other lines, such as CMD, DAT[7:0], CLK, etc.), or interface circuits, such as data control units, buffers, sampling circuits, or other intermediate circuits configured to process data to be communicated over, or otherwise process data received from the communication interface for use by the host 205, the eMMC 210, or one or more other circuits or devices.

The eMMC 210 can include a memory array and a memory controller, such as described and illustrated with respect to the storage system 110, and can provide data from the memory array to the host 205, or receive data from the host 205 to be stored on the memory array, using the data lines 217 according to the clock signal on the clock line 219. The host 205 and the eMMC 210 can send and receive a command signal and a response signal through a command line 216, and data and a status signal through a data bus (e.g., data lines 217).

In a write operation, the host 205 can provide data on the data lines 217 and a clock signal on the clock line 219. The eMMC 210 can sample data on the data lines 217 according to the clock signal and store the sampled data in the memory array. In a read operation, the eMMC 210 can provide data (e.g., read data) from the memory array to the data lines 217, for example, according to the clock signal on the clock line 219 (e.g., at rising edges of the clock signal, falling edges of the clock signal, or both rising and falling edges of the clock signal, depending on a data transmission mode, etc.).

In a read operation, the host eMMC 210 can provide data on the data lines 217, in certain examples, according to the clock signal on the clock line 219. The host 205 can sample data on the data lines 217, again, in certain examples, according to the clock signal. However, the lines of the communication interface are imperfect conductors having resistance, inductance, and capacitance. Accordingly, transitions on the data lines 217, from high to low or low to high, when they occur (the value of a data line may remain constant for multiple clock transitions), take time. Further, there is propagation delay between the host 205 and the eMMC 210. As the working frequency of the eMMC 210 increases, the clock period decreases (in certain examples, approaching the propagation delay between the host 205 and the eMMC 210 or vice versa), and thus, the time period for sampling the data lines 217 becomes smaller. Accordingly, as the sampling time decreases, synchronizing communication between the host 205 and the eMMC 210, such as to avoid sampling during transitions, can become challenging. To improve synchronization, the JEDEC eMMC standard 5.0 introduced a data strobe signal from the eMMC 210 to the host 205 over a data strobe (DS) line 218 during high-speed communication.

The JEDEC eMMC standard 5.1 does not require the data strobe signal in HS200 mode (200 MHz, providing 200 MB/s at a single data rate, etc.), or any mode of communication or data transfer slower than HS400 mode (double data rate (DDR) transfer of data at both rising and falling edges of a 200 MHz clock signal (400 MB/s), etc.).

During high-speed communication, such as defined by one or more communication specification or standard (e.g., JEDEC eMMC standard 5.1 defines a high-speed mode as HS400, etc.), the eMMC 210 can provide a data strobe signal on the data strobe line 218, the data strobe signal synchronous with data transitions on the data lines 217. The host 205 can sample data on the data lines 217 (e.g., using a sampling stage circuit) according to the data strobe signal.

In other examples, the host 205 can determine a timing relationship between the data strobe signal and an internal clock signal (e.g., the clock signal from the clock line 219), such as to align read data on the data lines 217 for sampling, for example, using a delay circuit 225 (e.g., a programmable, selectable, adjustable, or other analog or digital delay circuit, such as an FPGA delay component configured to provide a configurable delay). In an example, the delay circuit 225 can include one or more delay circuits (e.g., a first delay circuit (or one or more delay circuits) on the data lines 217, a second delay circuit on the clock line 219, or one or more other delay circuits, such as on the data strobe line 218, etc.). The host 205 can use the data strobe signal to determine the transition time of the data on the data lines 217, and accordingly, the propagation delay between the eMMC 210 and the host 205.

In certain examples, operating conditions (e.g., temperature changes, supply voltage levels, etc.) can affect the propagation delay between the host 205 and the eMMC 210. Accordingly, the propagation delay can change, even after being previously determined, and even within or during a single operation (e.g., an extended read operation, etc.). The host 205 can determine a timing relationship, transition time, or propagation delay of data from the eMMC 210, to determine an optimal sampling time (e.g., a data strobe transition time plus a delay, such as a portion of the clock period, etc.), such as to avoid sampling during data transitions.

The host 205 can include a first sampling stage circuit 220 or other sampling circuit configured to sample data on the data lines 217. In the absence of a data strobe signal or a data strobe line (or in certain examples, in combination therewith), the host 205 can include one or both of a data delay circuit configured to delay the data from the data lines 217, or a clock delay circuit configured to delay the clock signal from the clock generator circuit 221, such that the first sampling stage circuit 220 is configured to sample the data lines 217 outside of the transition periods of the data signals, accounting for propagation or other delay between the host 205 and the eMMC 210 or within the host 205 or the eMMC 210. In certain examples, one or both of the data delay circuit or the clock delay circuit can be determined using detected error rates (e.g., of known sample data, for example, including transitions at every clock cycle, or a known transition pattern, etc.), sampling at different delay values to determine transition periods, or one or more other method to determine transitions on the data lines 217. The delay of the delay circuits (e.g., the data delay circuit or the clock delay circuit) can be configurable, the values selected by comparing results over one or more read operations. In certain examples, the delay circuits referred to herein can be a component of the host 205, or in other examples, can be an external component separate from but between the host 205 and the eMMC 210, but coupled to general-purpose input/output (IO) of the host 205.

Whereas certain data modes, such as HS200, provide a dedicated data block having a known pattern for tuning communication variables, such as delay circuits, propagation delay, etc., the HS400 mode does not provide such dedicated data block. Further, during long read operations or other use conditions, operating conditions may change (e.g., temperature, supply voltage, etc.), such that the location of a valid data window may change with respect to the sampling clock of the host 205. When in use, a data strobe signal tracks changes in operating conditions. However, when intermittently using the data strobe signal to calibrate the propagation delay, the calibration can be performed according to different criteria (and or combinations thereof), including, for example: (i) regularly checked (e.g., at predetermined intervals, a specific time period, number of clock cycles, read operations, etc.), (ii) checked in response to detected errors (e.g., a threshold number of detected errors, error rates above a threshold, etc.), or (iii) checked in response to a change in conditions (e.g., temperature change, supply voltage change, etc.). In between calibrations, the data strobe line 218 can be used to transfer data between the eMMC 210 and the host 205 (e.g., from the eMMC 210 to the host 205 in response to a read command, etc.).

In an example, the measurement circuit 222 can determine a delay to apply to a delay circuit, such as a data delay circuit configured to delay the data on the data lines 217, before reaching the first sampling stage circuit 220. The measurement circuit 222 can receive the clock signal from the clock generator circuit 221, and a data strobe signal from the eMMC 210, and can determine a propagation delay between the clock signal at the host 205 and the data strobe signal received from the eMMC 210. In other examples, the measurement circuit 222 can determine the delay using a comparison of a number or range of applied delay values to one or more known data strings, or known transitions. The measurement circuit 222 can determine the delay as a function of the alignment of transitions on the clock signal and the data strobe signal, or can be configured to select one of a plurality of predetermined delays, such as using a best fit analysis, or a closest fit between the propagation delay and one or more predetermined delay values. In an example, a result of the measurement circuit 222 can be evaluated, such as by a host processor or one or more other component of the host 205, either in software or hardware. The data delay circuit can be a component of the first sampling stage circuit 220, or a separate component, as illustrated in FIG. 2, and can be controlled by the measurement circuit 222 or one or more other component of the host 205.

In HS400 mode, the data strobe signal represents a dual data rate (DDR) pattern of data, continuously switching (1-0-1-0- . . . ) at each clock edge, rising and falling, representing a critical pattern to test the sampling capability of the host 205. The data strobe signal pattern is independent of data on an accessed block of the eMMC 210. In certain examples, the first sampling stage circuit 220 can remain unchanged, and a data delay circuit can be applied to the data lines 217, but the value of the delay can be measured using the data strobe signal. The measurement circuit 222 can evaluate the data strobe signal on the data strobe line 218, use the data strobe signal to determine the delay for the data delay circuit (e.g., alignment of the data strobe signal to the clock signal, etc.). Then, after the delay is determined, a data strobe delay circuit can apply a delay to the data strobe line 218 (e.g., equal to the delay of the data delay circuit). The data strobe line 218, when not in use for calibration of the propagation delay between the host 205 and the eMMC 210, can be used as an additional data line (e.g., DAT8) between the eMMC 210 and the host 205, such as for read, write, or one or more other memory or data transfer operations. When intermittently using the data strobe signal to calibrate the propagation delay, the calibration can either be regularly checked (e.g., at predetermined intervals, a specific time period, number of clock cycles, read operations, etc.), checked in response to detected errors (e.g., a threshold number of detected errors, error rates above a threshold, etc.), or a change in conditions (e.g., temperature change, supply voltage change, etc.). In certain examples, the delay of one or more of the delay circuits can be evaluated, determined, or executed by hardware, software, or a combination thereof.

In other examples, in a system not having the data strobe feature, one of the data lines 217 can provide a data strobe signal to the host 205 for calibration purposes, for example, providing a pattern of data, continuously switching (1-0-1-0- . . . ) at each clock edge, rising and falling, such that one of the data lines 217 (e.g., DAT0, DAT7, etc.) can be used to calibrate the sampling capability of the host 205. In an example, the data lines 217 can be used to calibrate the propagation delay between the host 205 and the eMMC 210. When intermittently using the data line to calibrate the propagation delay, the calibration can either be regularly checked (e.g., at predetermined intervals, a specific time period, number of clock cycles, read operations, etc.), checked in response to detected errors (e.g., a threshold number of detected errors, error rates above a threshold, etc.), or a change in conditions (e.g., temperature change, supply voltage change, etc.).

In an example, the measurement circuit 222 can determine the delay or alignment between the clock signal and the data strobe, and either provide a delay to the delay circuits or other components of the host 205, or provide delay or alignment information to one or more other component of the host 205, such as the host processor or other component. In an example, after the value of the delay is determined, the measurement circuit 222 can evaluate drift of the data strobe signal at every read operation, at regular intervals, or at one or more other trigger conditions (e.g., detected errors, temperature, supply voltage, etc.). The measurement circuit 222 can provide drift information to one or more other system components, such as a host processor or other circuit, to evaluate the delay for adjustment of the delay circuits (e.g., due to drift, etc.).

In an example, the host 205, the first sampling stage 220, the measurement circuit 222, or one or more other circuits or components can be configured to control the delay of one or more of the delay circuits using a number of steps, such as by providing a signal to an input delay register configured to control one or more of the delay circuits. In general, the number of steps or value of steps configurable by the input delay register (or other delay register or delay circuit) can be configured to cover half of a working clock period. For example, a delay circuit can be configured with a number of possible values (e.g., 32) to cover half a working clock period (e.g., HS400 mode (2.5 ns)). In other examples, other values or number of values can be used. Table 1 illustrates example delay taps for a delay circuit or input delay register.

TABLE 1

Input delay codes

| Tap | Input delay (5-bit code) | Input delay (ps) |
|---|---|---|
| 0 | 00000 | 0 |
| 1 | 00001 | 78 |
| 2 | 00010 | 156 |
| 3 | 00011 | 234 |
| 4 | 00100 | 312 |
| 5 | 00101 | 390 |
| 6 | 00110 | 468 |
| 7 | 00111 | 546 |
| 8 | 01000 | 624 |
| ... | ... | ... |
| 23 | 10111 | 1794 |
| 24 | 11000 | 1872 |
| 25 | 11001 | 1950 |
| 26 | 11010 | 2028 |
| 27 | 11011 | 2106 |
| 28 | 11100 | 2184 |
| 29 | 11101 | 2262 |
| 30 | 11110 | 2340 |
| 31 | 11111 | 2418 |

In certain examples, it can be important (such as in FPGA technology) to maintain a consistent delay across the communication interface and within the host 205. To maintain the consistent delay, the circuit paths of the different communication interface components can be similar, such that the total delay added by routing the signals through the circuit paths are not substantially different for the information on the data lines 217 in contrast to one or more of the data strobe line 218, the command line 216, or one or more other lines of the communication interface. As each component and process within the circuit has an associated delay, a similar circuit path, where possible, can be advantageous. Further, similar components within a system can provide other benefits, such as consistent fabrication processes, and in certain examples, shared system resources or other benefits of duplication of components or processes. Accordingly, to maintain consistent delays across the one or more command lines or other lines of the communication interface, such circuit paths can include similar components within the host 205. In other examples, the different circuit paths within the host 205 (e.g., the data strobe signal path, the data line signal path, etc.) can include different components with substantially different delays, and the host 205 can be configured to account for such differences by assigning different delay values to one or more delay circuits.

Figure 3:
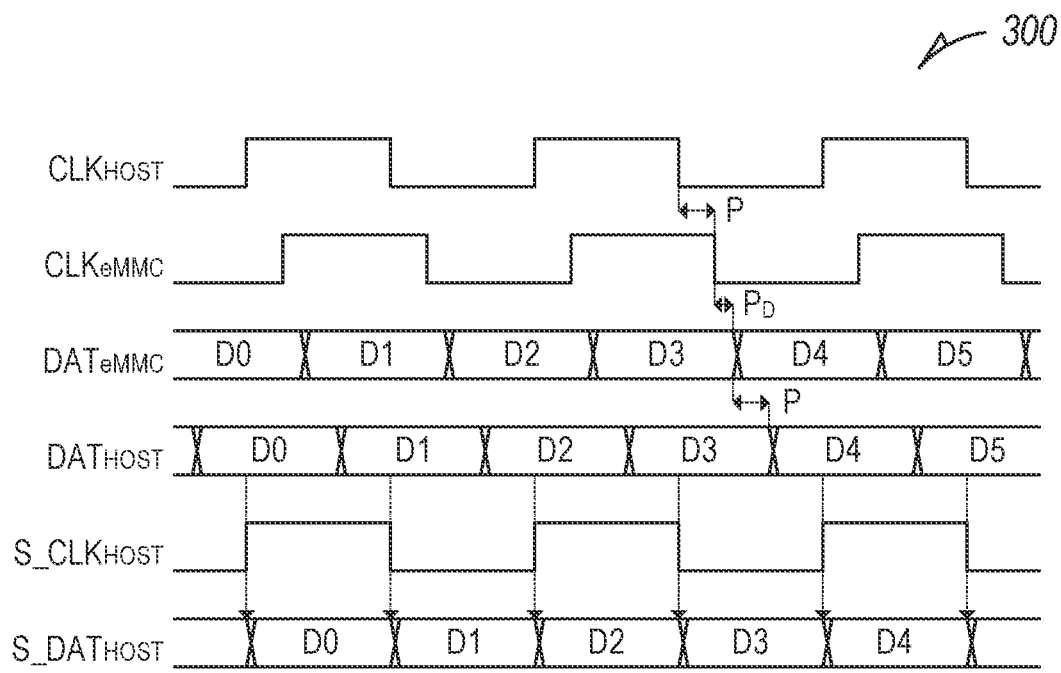
FIGS. 3-6 illustrate example timing diagrams of signals in an eMMC system.

FIG. 3 illustrates an example timing diagram 300 at a first working frequency. At low frequencies, a propagation delay (P) between the host and the eMMC is often less than the period of the clock signal. The propagation delay delays a clock signal at the memory system ($CLK_{eMMC}$) with respect to a clock signal at the host system ($CLK_{HOST}$), and accordingly, data signals at the host system ($DAT_{HOST}$) with respect to data signals at the memory system ($DAT_{eMMC}$). System propagation delay further includes a device propagation delay ($P_D$). A sampling clock ($S\_CLK_{HOST}$) transitions with the clock signal at the host system ($CLK_{HOST}$), such that the host samples data ($S\_DAT_{HOST}$) at a period that avoids transitions of the data signals at the host system ($DAT_{HOST}$).

Figure 4:
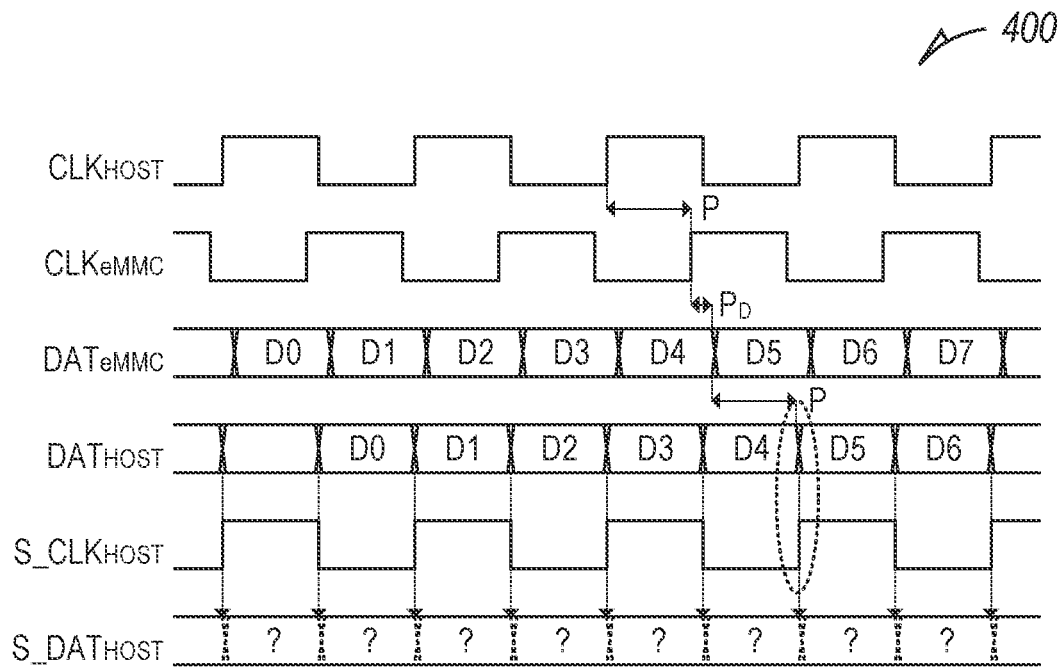

FIG. 4 illustrates an example timing diagram 400 at a second working frequency, higher than the first working frequency. In certain examples, a propagation delay (P) between the host and the eMMC can approach the working frequency. A sampling clock ($S\_CLK_{HOST}$) transitions with the clock signal at the host system ($CLK_{HOST}$), such that, in combination with the device propagation delay (Po), the host samples data ($S\_DAT_{HOST}$) at or near transitions of the data signals at the host system ($DAT_{HOST}$), often resulting in an unpredictable, and at times incorrect, sampling output.

Figure 5:
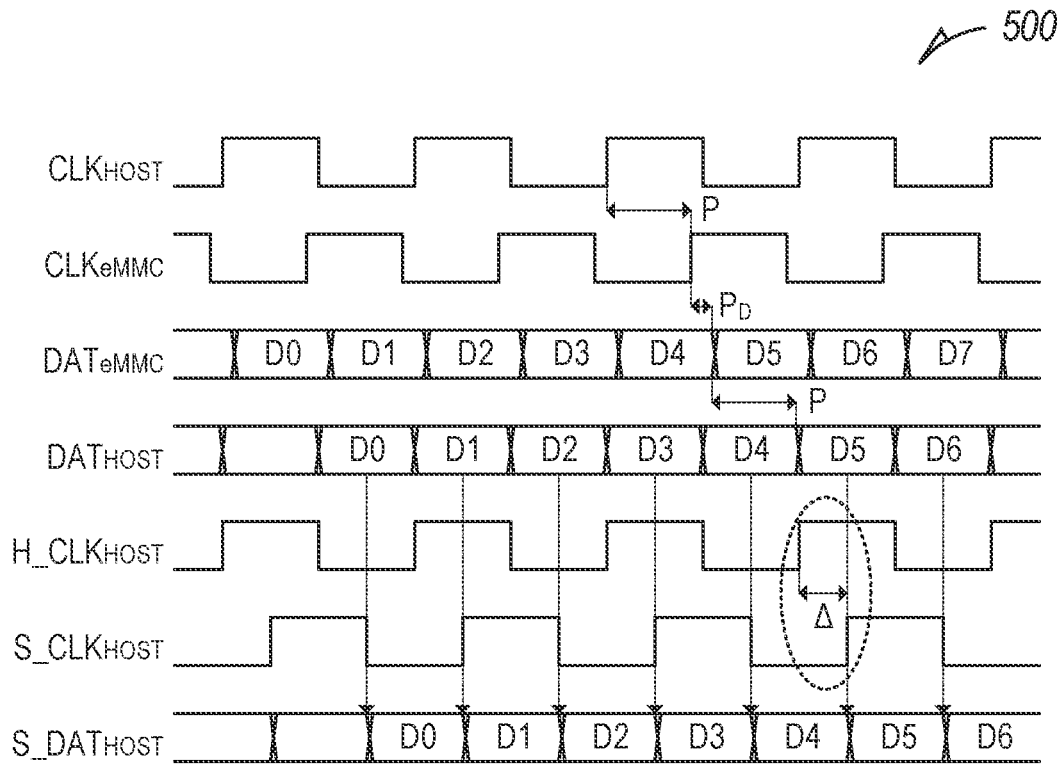

FIG. 5 illustrates an example timing diagram 500 at the second working frequency, with a delay (Δ) on a sampling clock ($S\_CLK_{HOST}$) with respect to a host clock ($H\_CLK_{HOST}$) to align sampling of the data signals at the host system ($DAT_{HOST}$), such that the host samples data ($S\_DAT_{HOST}$) at a period that avoids transitions of the data signals at the host system ($DAT_{HOST}$).

Figure 6:
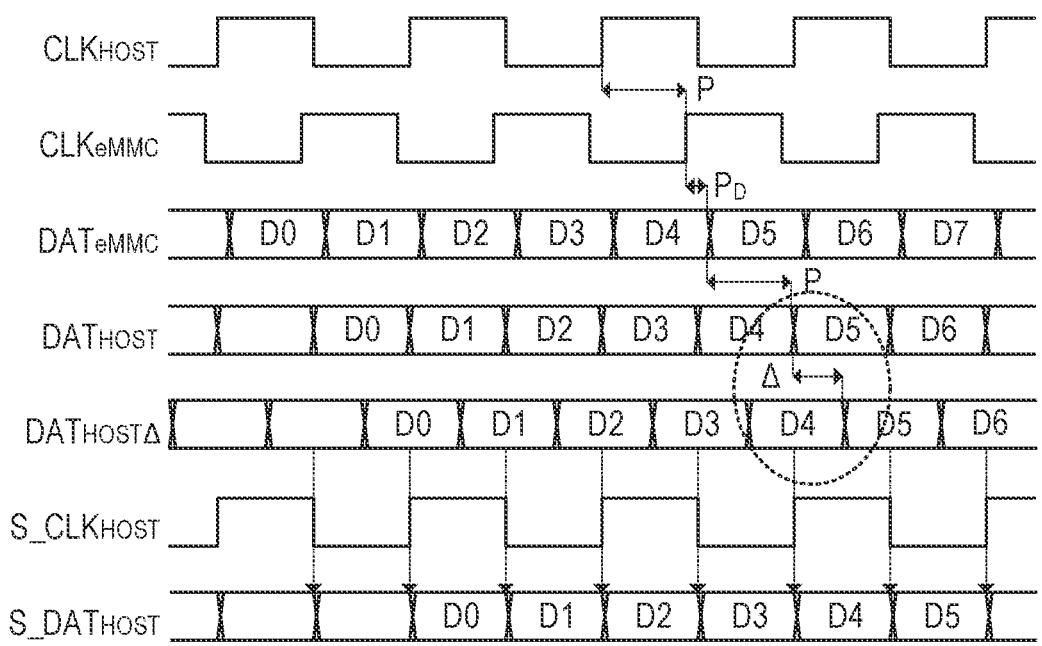

FIG. 6 illustrates an example timing diagram 600 at the second working frequency, with a delay (Δ) on data at the host ($DAT_{HOST}$) (illustrated as $DAT_{HOSTA}$) to align sampling of the data signals at the host system ($DAT_{HOST}$) using a sampling clock ($S\_CLK_{HOST}$), such that the host samples data ($S\_DAT_{HOST}$) at a period that avoids transitions of the data signals at the host system ($DAT_{HOST}$).

Figure 7:
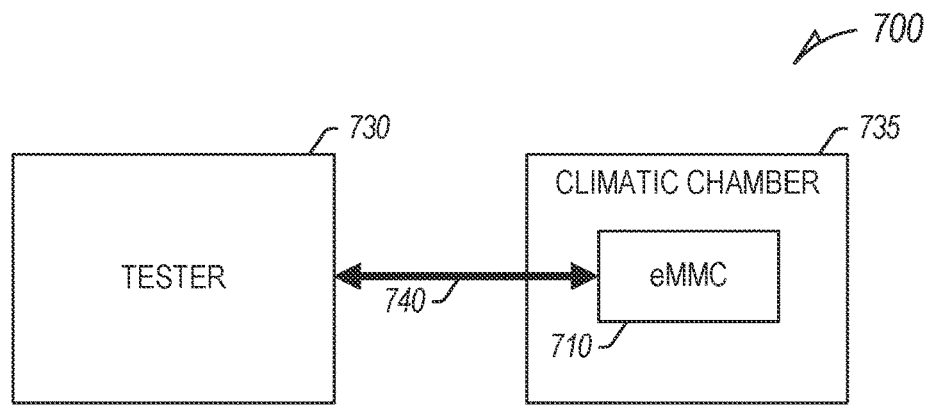
FIG. 7 illustrates an example test system for a memory system.

FIG. 7 illustrates an example test system 700 for a memory system, such as an eMMC 710, including a tester 730, a climatic chamber 735, and a communication interface 740 between the memory system in the climatic chamber 735 and the tester 730. In an example, the tester 730 can include a host system, such as that described above. In other examples, the tester 730 can include one or more other systems configured to communicate with the memory system, such as to measure a performance of the memory system in the climatic chamber 735. In an example, the tester 730 can control the climatic chamber 735. In certain examples, the tester 730 or host can be included in the climatic chamber 735.

In certain examples, the communication interface 740 can include a cable between the tester 730 and the climatic chamber. The length of the communication interface 740 can affect the propagation delay between the tester 730 and the memory system.

The present inventors have recognized, among other things, that limited periods of delay (e.g., 5 ns, one clock period, etc.) may not be enough to cover a propagation delay of a system, or that greater amounts of delay may be desired or advantageous, in certain examples, with a high degree of granularity (such as that disclosed in Table 1 or similar). For systems sampling at a rising or falling edge of the clock signal, the next rising or falling edge can be selected, providing a relatively large delay value that can be adjusted with one or more taps, such as illustrated above. In certain examples, the incremental 32 taps (in certain examples, representing one clock period) of Table 1 can be extended by additional clock period (e.g., 5 ns) or half-clock period (e.g., 2.5 ns) increments. Although illustrated herein as a 5 ns clock period represented by 32 taps, other clock periods or number of taps are contemplated.

Figure 8:
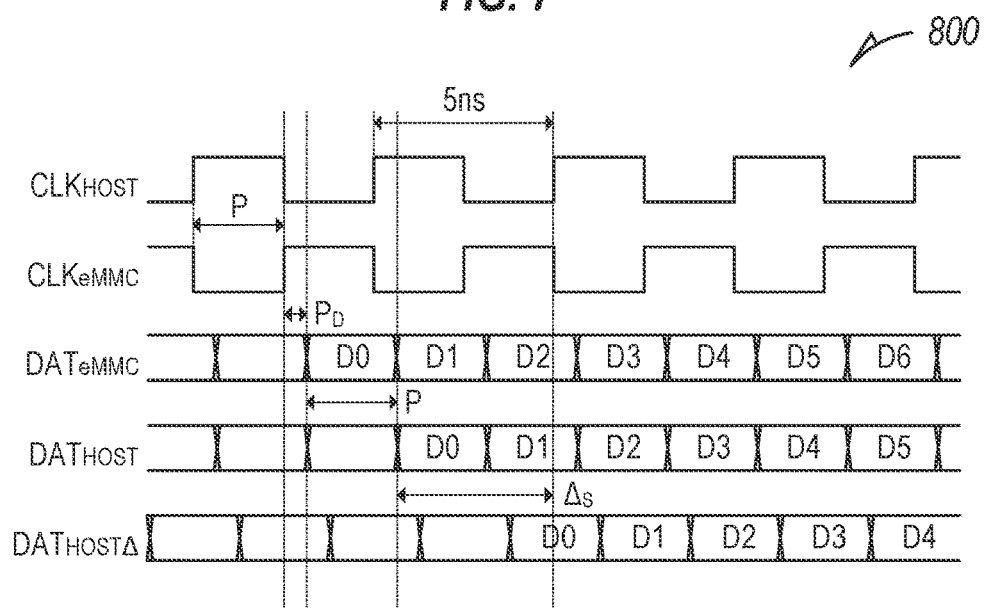
FIG. 8 illustrates an example timing diagram for a test system having an extended communication interface.

FIG. 8 illustrates an example timing diagram 800 for a test system having an extended communication interface (e.g., a cable) longer than a typical interface between a host and a memory system. In this example, the period of the clock signal is 5 ns, and the propagation delay (P) is approximately one-half of a clock period. Data signals at the memory system ($DAT_{eMMC}$) are delayed by the device propagation delay ($P_D$), and data signals at the host system (e.g., a tester) ($DAT_{HOST}$) are delayed by the propagation delay (P). In systems that sample at the rising edge, a sampling delay ($\Delta_S$) greater than one-half a clock period can be required to sample a first data signal (D0). In other examples, the sampling delay can be greater than the period of the clock signal. In certain examples, the sampling edge can be configured or selected as either a rising or falling edge of the clock signal.

In an example, a command signal or one or more data signals can be sampled using a sampling register on one or more of rising or falling edges of a clock signal to determine a desired delay value, or a desired delay tap, such as using a midpoint of a range of valid delay taps. A number of delay taps can be sampled for sequential edges of a clock signal, or for sequential rising or falling edges of a clock signal. Selecting a subsequent sampling edge can be referred to as sampling clock edge selection (ScES) and can refer to a selection of a subsequent edge of the clock signal, or to a selection of a subsequent rising or falling edge, depending on the number and range of steps.

TABLE 2

Symmetrical Valid Vector Outcome

| Step | Valid Vector without ScES | Step | Valid Vector with ScES |
|---|---|---|---|
| 0 | Pass | 0 | Fail |
| 1 | Pass | 1 | Fail |
| ... | Pass | ... | Fail |
| 5 | Pass | ... | Fail |
| 6 | Fail | ... | Fail |
| ... | Fail | ... | Fall |
| ... | Fail | 25 | Fail |
| ... | Fail | 26 | Pass |
| ... | Fail | ... | Pass |
| 30 | Fail | 30 | Pass |
| 31 | Fail | 31 | Pass |

In certain examples, a host system can sample each step with and without ScES and the pass windows of each selection can be aligned to extend the valid pass vector of the sampled signal. For example, Table 2 illustrates an example valid window between steps 0 and 5 without ScES enabled, and a valid window between steps 26 and 31 with ScES enabled. Thus, each selection separately has a valid window length of 6 steps. In a traditional selection technique or method, the tap would be selected as the midpoint of the valid window (e.g., tap 28 or 29 with ScES, and tap 2 or 3 without ScES).

TABLE 3

Valid Window

| Valid Vector with ScES | | | Valid Vector without ScES | | |
|---|---|---|---|---|---|
| Fail | | Pass | Pass | | Fail |
| ... 24 | 25 | 26 ... 31 | 0 | 1 ... 5 | 6 7 ... |

Table 3 illustrates that, in certain examples, the valid windows can be aligned (e.g., using a logical OR technique, etc.) to extend the range of the effective valid window. Here, as each window is correlated to the other, instead of a valid window length of 6 steps, the combined valid window is now 12 steps, and the tap can be selected at the edge of each individual window (e.g., tap 31 with ScES, and tap 0 without ScES). In certain examples, the techniques and methods disclosed herein can effectively double the effective range of a number of delay taps, in this example, from 32 to 64 taps. In other examples, other numbers, sizes, or ranges of delay taps can be used, and effectively increased accordingly.

In other examples, the host system can sample and store data in a circular buffer (e.g., using a host input circuit, a sampling stage, etc.). In certain examples, instead of starting at a zero delay, the techniques disclosed herein can enable the host system to set a negative delay, or a delay with respect to a preceding rising or falling edge of the clock signal. For example, above with respect to Table 3, the center of the illustrated pass window may be at a "0" delay. Using the techniques, systems, and methods disclosed herein, an effective negative delay can be applied by selecting a preceding clock edge.

Figure 9:
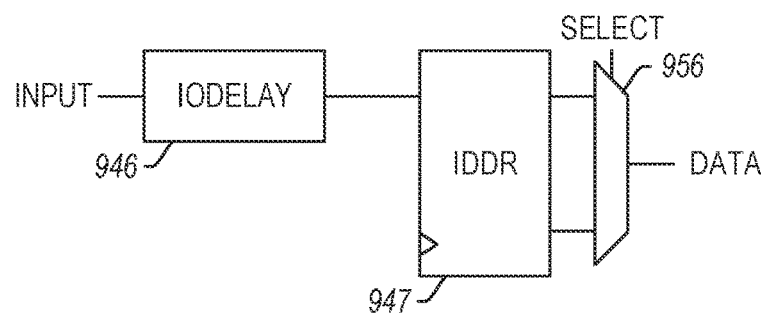
FIG. 9 illustrates an example sampling stage including a delay circuit and a sampling circuit.

FIG. 9 illustrates an example sampling stage 900 including a delay circuit (IODELAY) 946 and a sampling circuit, such as a double data rate input circuit (IDDR) 947. The IODELAY 946 can receive an input signal (INPUT) (e.g., a command signal, a data signal, etc.) and apply a configurable delay. The delay can be determined and applied in a calibration mode, separate from a communication mode (e.g., before or during communication, etc.). In other examples, the delay can be determined and applied during communication, applying different delays to the input signal as it is received.

The IDDR 947 can receive the delayed signal from the IODELAY 946 and provide rising and falling edge signals, or signals at one or more clock frequencies. The sampling stage 900 can further include a select circuit, such as a multiplexer circuit (MUX) 956, configured to receive a select signal, and provide one or more outputs (DATA) (e.g., rising edge, falling edge, first sampling frequency, second sampling frequency, etc.) corresponding to the select signal. In certain examples, the sampling stage 900 can be one of a number of sampling stages of a host device or test system, and can include one or more other components to provide the configurable delay and extended valid detection windows disclosed herein.

In an example, the sampling stage 900 can be configured to test a number of configurable delay values, such as a number of delay taps of the IODELAY 946. The sampling stage 900 can further select a subsequent edge of a clock signal (e.g., to account for possible bit slip), such as using the select circuit, to further test the effective delay range of the sampling stage 900, such as illustrated in the example Table 2, above. In certain examples, the sampling stage, or one or more other circuits or components, can be configured to align the valid windows, and to select a delay value and one or more respective outputs depending on the type of input signal received, the data mode, and the delay value.

Although IODELAY 946 is configured to delay to the input signal in FIG. 9, in other examples, the delay can be applied to the clock signal, or in certain examples, to both the input signal and to the clock signal.

Figure 10:
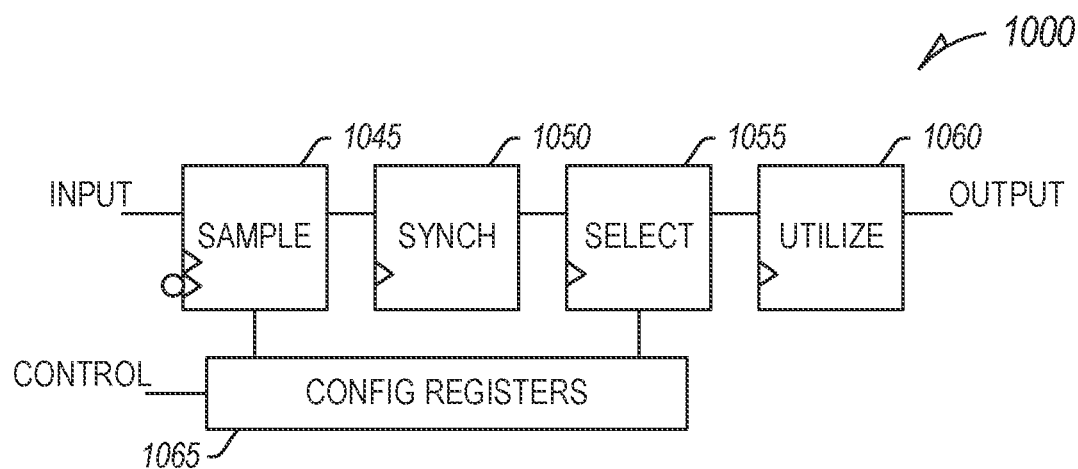
FIG. 10 illustrates an example host input stage including a sampling stage, a synchronization stage, a selection stage, a utilization stage, and configuration registers.

FIG. 10 illustrates an example host input stage 1000 including a sampling stage 1045, a synchronization stage 1050, a selection stage 1055, a utilization stage 1060, and configuration registers 1065 configured to provide control signals to the sampling and selection stages 1045, 1055. The sampling stage 1045 can receive an input signal (e.g., input signals from a command line, data lines [0:7], etc.) on both edges of a sampling clock.

The sampling stage 1045 can receive an input signal (INPUT) on both rising and falling edges of a sampling clock (illustrated as a clock and "not clock" signal inputs). In certain examples, the sampling stage 1045 can provide a delay to one or more of the sampled rising or falling edge signals, such as according to a host device, one or more configuration registers, etc. The synchronization stage 1050 can receive the sampled input signals, align one or more of the received sampled input signals, and provide one or more re-sampled versions. In certain examples, the synchronization stage 1050 can align a re-sampled falling edge input signal with the rising edge of the sampling clock. In an example, the synchronization stage 1050 can swap sampling edges of the re-sampled, and in certain examples aligned, signal.

The selection stage 1055 can select one or more sampling clock edges, in certain examples, controlling alignment of the re-sampled input signals from one of a number of pre-set, pre-determined, or selectable alignments, for example, using information from the configuration registers 1065. The configuration registers 1065 can control one or more of the delay of the sampling stage 1045, in certain examples providing one or more different delay taps to the input signal, or configuration of the selection stage 1055. The configuration registers 1065 can be programmed to provide certain selections based on received information, such as valid delay windows, rising or falling edges, the type of received information, input signal, or communication, the data mode, the delay value, the order of received or aligned information, etc.

The utilization stage 1060 can utilize the aligned or re-sampled input signals to execute one or more operations, such as at or by a host or tester. The output of the selection stage 1055 can be independent on the alignment with sampling edges of the clocks signal, re-aligned and re-sampled by the previous stages. Accordingly, the utilization stage 1060 can utilize data from the input signal without consideration to the original alignment or clock signal.

In an example, the host input stage 1000 can calibrate, resample, and align the data from the input signal depending on a functional mode of one or more of the host or storage systems. For example, the storage system can include an eMMC device having different functional modes, such as a low-speed mode (e.g., HS200) or a high-speed mode (e.g., HS400), a single data rate (SDR) mode or a dual data rate (DDR) mode, etc.

Figure 11:
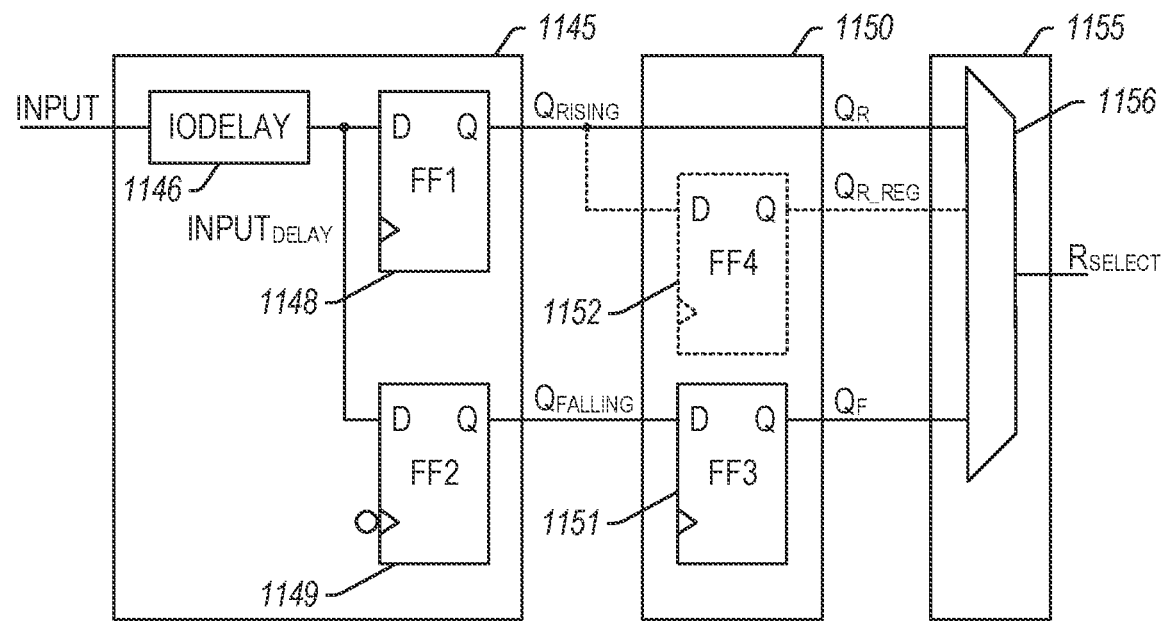
FIG. 11 illustrates portions of an example host input stage including a sampling stage, a synchronization stage, and a selection stage.

FIG. 11 illustrates portions of an example host input stage 1100 including a sampling stage 1145, a synchronization stage 1150, and a selection stage 1155. The sampling stage 1145 can include a delay circuit (IODELAY) 1146 configured to selectively apply a configurable delay to an input signal (INPUT), such as from an input circuit of a host system, and provide one or more outputs, such as data from the input signal at respective rising and falling edges of a clock signal (e.g., $Q_{RISING}$, $Q_{FALLING}$, etc.).

The IODELAY 1146 can selectively provide a configurable delay (e.g., one or more delay taps, etc.) to shift the input signal to ensure adequate setup and hold timings to avoid sampling during data transitions. The IODELAY 1146 can check possible delay values to align the sampling clock between data transitions. In certain examples, all possible delay values can be checked to select the best alignment (e.g., a midpoint of acceptable pass delay taps, etc.).

The sampling stage 1145 can include one or more circuits configured to sample the data on the input signal, such as first and second flip flops (FF1, FF2) 1148, 1149, etc. In an example, the first flip flop (FF1) 1148 and the second flip flop (FF2) 1149 can receive and sample the delayed input signal at rising and falling edges of a sampling clock, respectively. The first flip flop 1148 can be configured to sample the received delayed input signal and provide sampled data corresponding to the rising edge of the sampling clock ($Q_{RISING}$), and the second flip flop 1149 can be configured to sample the received delayed input signal and provide sampled data corresponding to the falling edge of the sampling clock ($Q_{FALLING}$).

The synchronization stage 1150 can align the output of the sampling stage 1145, such as using one or both of third or fourth flip flops (FF3, FF4) 1151, 1152, depending on the delay and order of sampling in the sampling stage 1145, and provide one or more output signals (e.g., $Q_R$, $Q_{R\_REG}$, $Q_F$, etc.). In an example, the third flip flop (FF3) 1151 can transition an output of the sampling stage from a falling edge of the sampling clock to a rising edge of the sampling clock (or vice versa), such that the outputs of the synchronization stage 1150 transition at the same clock edge (and in order). To avoid setup and hold timing issues, the third and fourth flip flops (FF3, FF4) 1151, 1152 can be located in the circuit of the host input stage 1140, such that propagation delay differences between the circuit paths associated with the third and fourth flip flops (FF3, FF4) 1151, 1152 are negligible with respect to an available sampling time in a sampling period.

In certain examples, aligning the output of the sampling stage 1145, such as using the synchronization stage 1150, is not enough to guarantee the correct data interpretation in for the following stages. For example, a protocol signal can be used just as SDR (e.g., a command line of a storage system, such as an eMMC device), such that management of data selection to solve eventual bit slip can be easier than the general case. In other examples, a protocol signal can be used as either SDR or DDR according to the currently configured functional mode of the storage system (e.g., data lines of the storage system, such as an eMMC device, etc.). In certain examples, a protocol signal can be configured as DDR but used to transfer data in SDR mode, such as in certain data exchanges between a host system and a storage system. For example, a data line (e.g., DATline[0], etc.) can transfer data as well as other information (e.g., a CRC status token, a BOOT acknowledge, etc.) having SDR behavior in DDR mode.

The selection stage 1155 can select one or more of the outputs of the synchronization stage 1150, depending on the functional mode of the storage system, or the alignment of the data in one or more of the previous stages and the available delay from the delay circuit, such as using a multiplexer circuit (MUX) 1156 or one or more other select circuits. For example, in SDR mode, if the available delay from the delay circuit (e.g., limited FPGA technology) is less than required to align the data using a rising edge of the sampling clock (e.g., $Q_R$), the selection circuit 1155 can select an output of the synchronization stage corresponding to a falling edge of the sampling clock (e.g., $Q_F$, in certain examples, resynchronized to the rising edge of the sampling clock in the synchronization stage 1150), such as by testing each step at each edge and delay value and selecting the center step of a resulting pass window. In an example, the MUX 1156 can be controlled using a bit stored in a configuration register (e.g., the configuration registers 1465). In certain examples, the center step of the resulting pass window can be a combination of the rising and falling edge outputs of the synchronization stage 1150, and the selection stage can provide a resulting selection signal ($R_{SELECT}$) using a combination of the rising and falling edge data.

Figure 12:
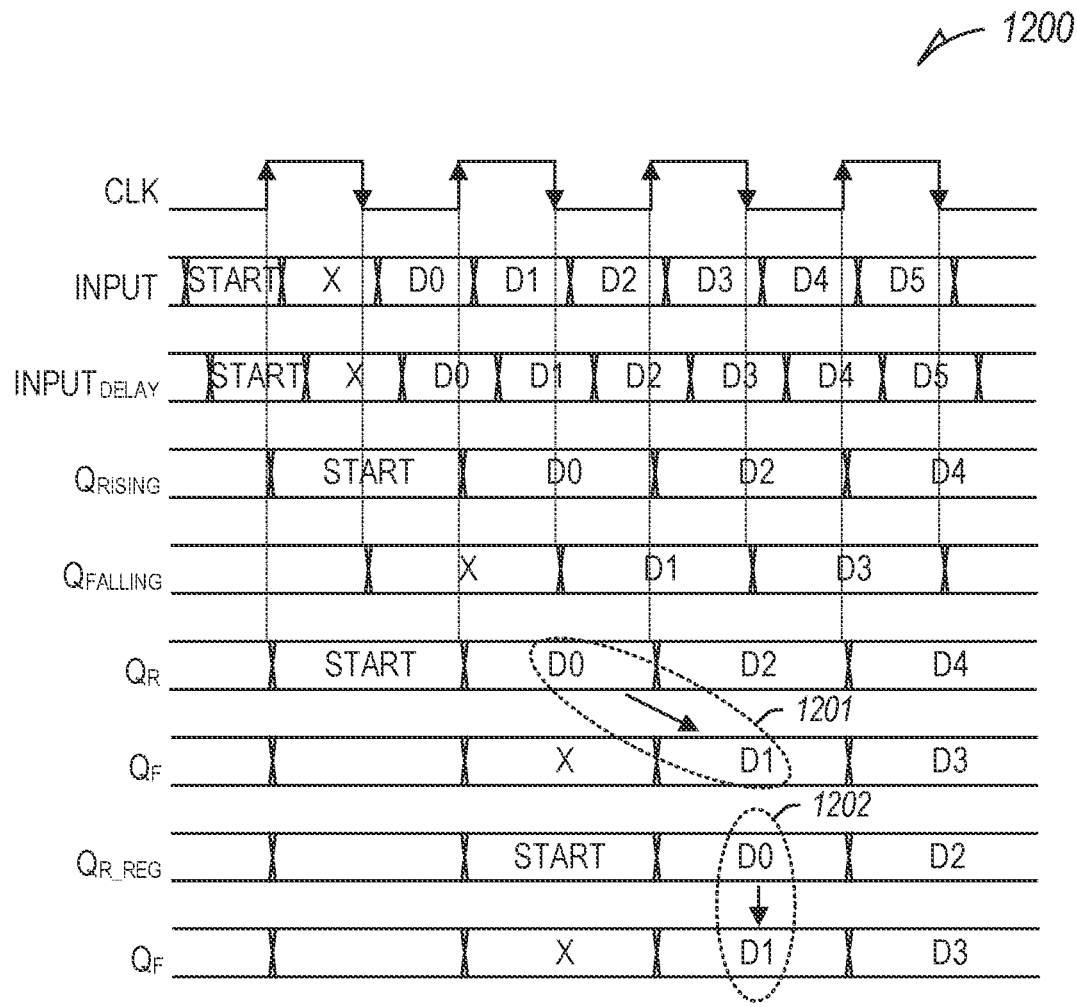
FIG. 12 illustrates an example timing diagram of host input stage signals.

FIG. 12 illustrates an example timing diagram 1200 of host input stage signals from one or more of the host input stages 1000, 1100 of the examples of FIGS. 10-11, such as signals from a sampling stage (e.g., the sampling stage 1445, 1145) or a synchronization stage (e.g., the synchronization stage 1450, 1150).

In an example, signals from the sampling stage can include a clock signal (CLK), an input signal (INPUT), and a delayed input signal ($INPUT_{DELAY}$), such as output from a delay circuit (e.g., IODELAY 1146) to align data in the input signal with the transitions of the sampling clock (e.g., CLK), each in DDR mode. The output of the sampling stage can include data from the input signal at rising and falling edges of the clock signal, $Q_{RISING}$ and $Q_{FALLING}$ respectively, each in SDR mode.

In certain examples, depending on whether or not the input signal is first sampled on a rising or falling edge of the clock signal, resulting sampled data (e.g., START, X, D0, D1, D2, etc.) can be aligned and paired (e.g., a pair START/X in a first SDR cycle, a pair D0/D1 in a second SDR cycle, etc.) at the output of the synchronization stage (QR and QF), for example, using one or more flip flops or other sample and hold circuits.

In certain examples, the input signal (INPUT) can be delayed (with respect to the clock signal) such that it is not possible to apply a delay great enough to align data for sampling at a first edge of the clock signal, such that a subsequent edge can be selected. In such examples, components from the synchronization stage or a selection stage (e.g., the selection stage 1455, 1155) can be used to reorder the data. For example, as illustrated at 1201, the sampled data at rising and falling edges of the clock signal (QR and QF, respectively) can be misaligned, where data pairs are misaligned (e.g., D0/X, D2/D1, etc.). In such examples, as illustrated at 1202, the sampled data can be reordered, such as delayed one clock cycle using an additional flip flop or sample and hold circuit, resulting in aligned data pairs (e.g., START/X, D0/D1, etc.). In such examples, a multiplexer circuit in the selection stage can select a delayed sampled data at a rising edge of the clock signal ($Q_{R\_REG}$) and the sampled data at the falling edge of the clock signal ($Q_F$).

Figure 13:
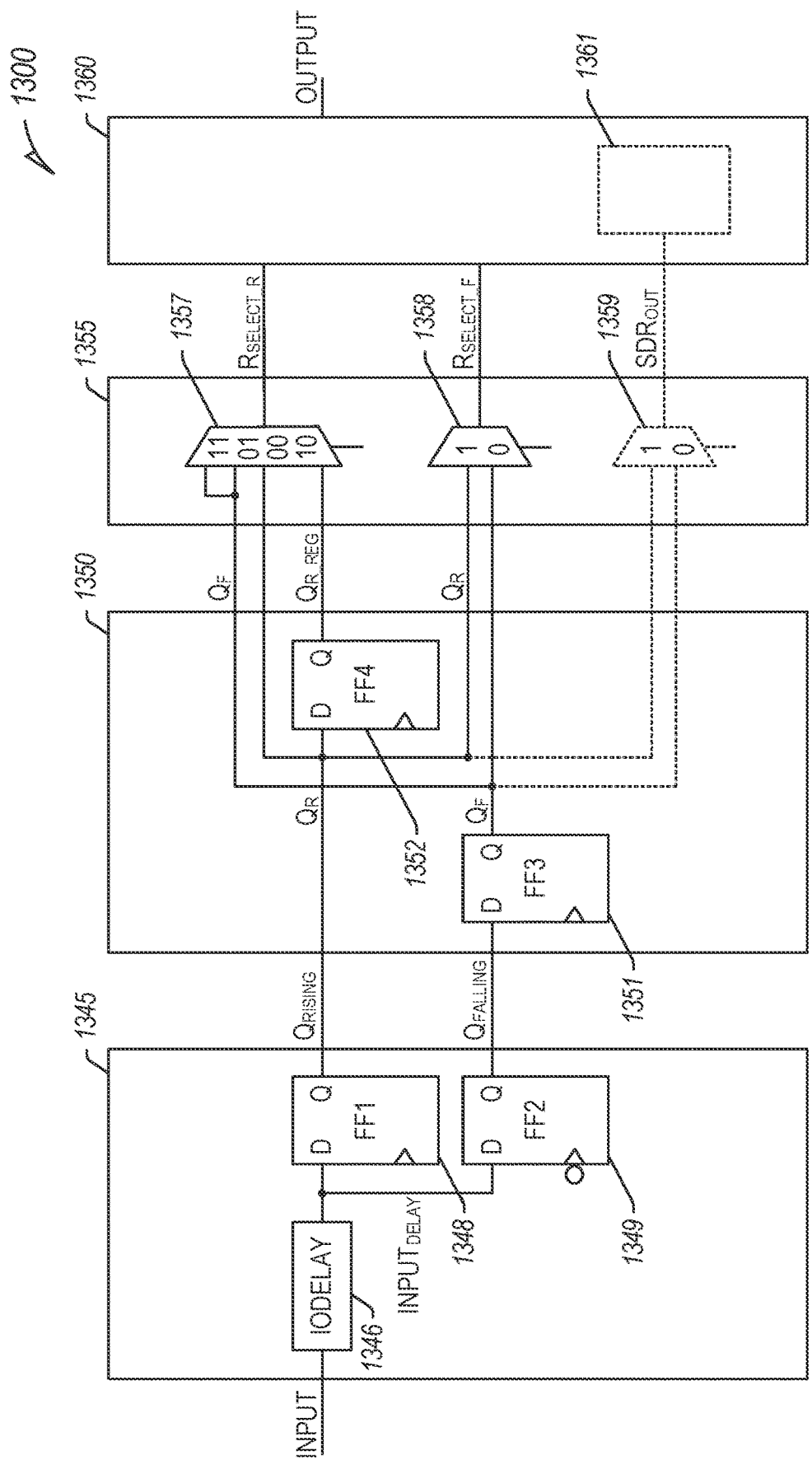
FIG. 13 illustrates an example host input stage including a sampling stage, a synchronization stage, a selection stage, and a utilization stage.

FIG. 13 illustrates an example host input stage 1300 including a sampling stage 1345, a synchronization stage 1350, a selection stage 1355, and a utilization stage 1360. The sampling stage 1345, including first and second flip flops (FF1, FF2) 1348, 1349, and the synchronization stage 1350 including third and fourth flip flops (FF3, FF4) 1351, 1352 are similar to that disclosed and described in the example of FIG. 11.

The selection stage 1355 includes a number of multiplexer circuits (MUX), including a first MUX 1357 configured to receive various data signals, including $Q_F$, $Q_R$, and $Q_{R\_REG}$, and to provide a first output ($R_{SELECT\_R}$) depending on a selection signal, such as from one or more configuration registers or other controller or component. In an example, the selection signal can depend on, among other things, the data mode (e.g., SDR or DDR mode), or the selection of bit slip to align data for sampling. For example, for SDR mode without bit slip, the selection signal can indicate a selection of [00], providing $Q_R$ at $R_{SELECT\_R}$. For SDR mode with bit slip, the selection signal can indicate a selection of [01], providing $Q_F$ at $R_{SELECT\_R}$. For DDR mode without bit slip, the selection signal can indicate a selection of [10], providing $Q_{R\_REG}$ at $R_{SELECT\_R}$. For DDR mode with bit slip, the selection signal can indicate a selection of [11], providing $Q_F$ at $R_{SELECT\_R}$.

Similarly, the selection stage 1355 can include a second MUX 1358 configured to receive $Q_R$ and $Q_F$ and provide a second output ($R_{SELECT\_F}$) depending on a selection signal, such as from one or more configuration registers or other controller or component. For example, for SDR or DDR mode without bit slip, the selection signal can indicate a selection of [0], providing $Q_F$ at $R_{SELECT\_F}$. For SDR or DDR mode with bit slip, the selection signal can indicate a selection of [1], providing $Q_R$ at $R_{SELECT\_F}$. The first and second outputs can be provided to the utilization stage 1360.

In certain examples, a data line (e.g., DATline[0]) can be used to transfer SDR data as well as other signals in DDR mode. The switch between DDR mode to SDR mode often won't allow time to alter the previous behavior of the other components of the host input stage (e.g., the first or second MUX 1357, 1358, etc.). In such examples, the selection stage 1355 can include a third MUX 1359 configured to receive SDR data, such as a CRC status token or a BOOT acknowledge (e.g., $Q_R$ and $Q_F$), and provide an output ($SDR_{OUT}$) to the utilization stage 1360 separate from the DDR data (e.g., from the first and second MUX 1357, 1358). The third MUX 1359 can receive a selection signal, such as from one or more configuration registers or other controller or component. In an example, for an SDR mode signal (e.g., CRC status token or BOOT acknowledge) without bit slip, the selection signal can indicate a selection of [0], providing $Q_F$ at an output of the MUX 1359. For an SDR mode signal with bit slip, the selection signal can indicate a selection of [1], providing $Q_R$ at the output of the MUX 1359.

The utilization stage 1360 can include one or more circuits or stages configured to utilize properly aligned and ordered data from the preceding host input stages. In certain examples, the utilization stage 1360 can include a separate utilization stage 1361 for SDR data received during DDR mode, such as a CRC status token utilization stage or a BOOT acknowledge utilization stage, etc.

TABLE 4

Example Selection

| | With Bit Slip | | Without Bit Slip | |
| --- | --- | --- | --- | --- |
| | $R_{SELECT\_R}$ | $R_{SELECT\_F}$ | $R_{SELECT\_R}$ | $R_{SELECT\_F}$ |
| SDR mode | $Q_F$ | $Q_R$ | $Q_R$ | $Q_F$ |
| DDR mode | $Q_F$ | $Q_R$ | $Q_{R\_REG}$ | $Q_F$ |

Table 4 illustrates the example selections described above with respect to the example of FIG. 13. In other examples, one or more other selections or combinations, depending on circuit architecture, propagation delay, etc., can be made.

Figure 14:
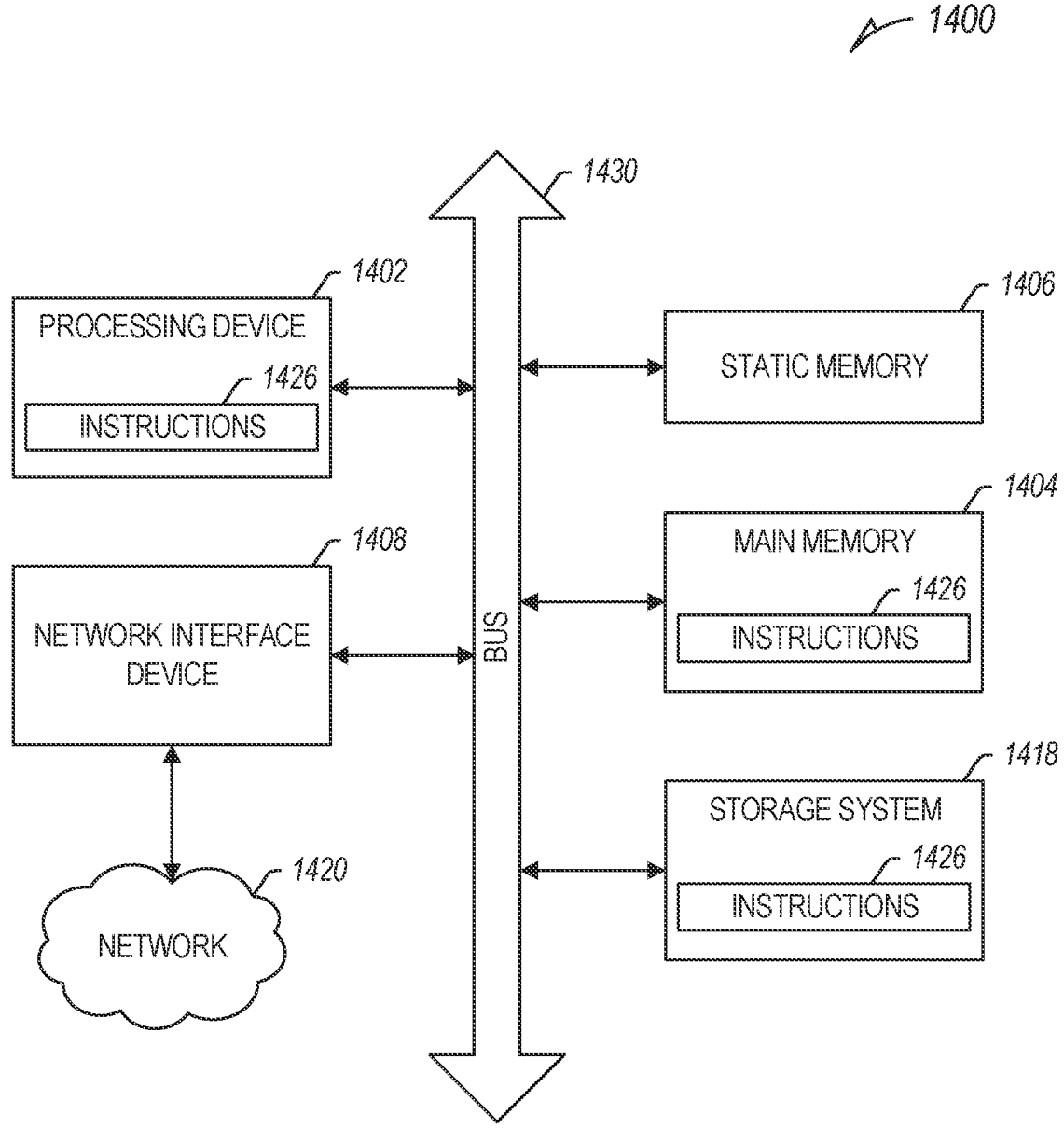
FIG. 14 illustrates a block diagram of an example machine upon which any one or more of the techniques (e.g., methodologies) discussed herein may perform.

FIG. 14 illustrates a block diagram of an example machine 1400 upon which any one or more of the techniques (e.g., methodologies) discussed herein may perform, such as triggering a CSAVE operation in a memory device (e.g., an NVDIMM) using a timer implemented using a memory controller of the NVDIMM. In alternative embodiments, the machine 1400 may operate as a standalone device or may be connected (e.g., networked) to other machines. In a networked deployment, the machine 1400 may operate in the capacity of a server machine, a client machine, or both in server-client network environments. In an example, the machine 1400 may act as a peer machine in peer-to-peer (P2P) (or other distributed) network environment. The machine 1400 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible overtime and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1400 (e.g., the host 105, the storage system 110, etc.) may include a hardware processor 1402 (e.g., a central processing unit (CPU), a graphics processing unit (GPU), a hardware processor core, or any combination thereof, such as a memory controller, etc.), a main memory 1404 and a static memory 1406, some or all of which may communicate with each other via an interlink (e.g., bus) 1430. The machine 1400 may further include a display unit, an alphanumeric input device (e.g., a keyboard), and a user interface (UI) navigation device (e.g., a mouse). In an example, the display unit, input device and UI navigation device may be a touch screen display. The machine 1400 may additionally include a signal generation device (e.g., a speaker), a network interface device 1408, and one or more sensors, such as a global positioning system (GPS) sensor, compass, accelerometer, or other sensor. The machine 1400 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1400 may include a storage system (e.g., a machine-readable medium) on which is stored one or more sets of data structures or instructions 1426 (e.g., software) embodying or utilized by any one or more of the techniques or functions described herein. The instructions 1426 may also reside, completely or at least partially, within the main memory 1404, within static memory 1406, or within the hardware processor 1402 during execution thereof by the machine 1400. In an example, one or any combination of the hardware processor 1402, the main memory 1404, the static memory 1406, or the storage system 1418 may constitute a machine-readable medium. The term "machine-readable medium" may include a single medium or multiple media (e.g., a centralized or distributed database, or associated caches and servers) configured to store the one or more instructions 1426.

The term "machine-readable medium" may include any medium that is capable of storing, encoding, or carrying instructions for execution by the machine 1400 and that cause the machine 1400 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1426 (e.g., software, programs, an operating system (OS), etc.) or other data are stored on the storage system 1418, can be accessed by the memory 1404 for use by the processor 1402. The memory 1404 (e.g., DRAM) is typically fast, but volatile, and thus a different type of storage than the storage system 1418 (e.g., an SSD), which is suitable for long-term storage, including while in an "off" condition. The instructions 1426 or data in use by a user or the machine 1400 are typically loaded in the memory 1404 for use by the processor 1402. When the memory 1404 is full, virtual space from the storage system 1418 can be allocated to supplement the memory 1404; however, because the storage system 1418 device is typically slower than the memory 1404, and write speeds are typically at least twice as slow as read speeds, use of virtual memory can greatly reduce user experience due to storage device latency (in contrast to the memory 1404, e.g., DRAM). Further, use of the storage system 1418 for virtual memory can greatly reduce the usable lifespan of the storage system 1418.

In contrast to virtual memory, virtual memory compression (e.g., the Linux™ kernel feature "ZRAM") uses part of the memory as compressed block storage to avoid paging to the storage system 1418. Paging takes place in the compressed block until it is necessary to write such data to the storage system 1418. Virtual memory compression increases the usable size of memory 1404, while reducing wear on the storage system 1418.

Storage systems optimized for mobile electronic devices, or mobile storage, traditionally include MMC solid-state storage systems (e.g., micro Secure Digital (microSD™)

cards, etc.). MMC devices include a number of parallel interfaces (e.g., an 8-bit parallel interface) with a host, and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage systems have shifted from parallel to serial communication interfaces. Universal Flash Storage (UFS) devices, including controllers and firmware, communicate with a host using a scalable low-voltage signaling (SLVS) serial interface with dedicated read/write paths, further advancing greater read/write speeds.

The instructions 1426 may further be transmitted or received over a communications network 1420 using a transmission medium via the network interface device 1408 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1408 may include one or more physical jacks (e.g., Ethernet, coaxial, or phone jacks) or one or more antennas to connect to the communications network 1420. In an example, the network interface device 1408 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1400, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

An example (e.g., "Example 1") of subject matter (e.g., a system) can include a host input circuit of a host configured to communicate data and clock signals to a memory device, the host input circuit configured to apply an effective sampling delay to one of an input signal or a clock signal, the host input circuit including: a delay circuit configured to apply a configurable delay of a finite range to one of the input signal or the clock signal with respect to a first edge of the clock signal; a sampling circuit configured to sample the input signal using the clock signal according to the configurable delay; and a selection circuit configured to selectively align the sampled input signal to a subsequent, second edge of the clock signal to extend the configurable delay of the host input circuit.

In Example 2, the subject matter of Example 1 can optionally be configured such that the configurable delay of the delay circuit has a finite range and the selection circuit is configured to extend the range of the configurable delay of the host input circuit beyond the finite range of the delay circuit.

In Example 3, the subject matter of any one or more of Examples 1-2 can optionally be configured such that the configurable delay includes a number of delay taps, a range of the delay taps covers half of a period of the clock signal or less, and the selection circuit is configured to selectively align the sampled input to the subsequent, second rising or falling edge of the clock signal to extend the range of the configurable delay of the host input circuit beyond the half of the period of the clock signal without increasing the number of the delay taps.

In Example 4, the subject matter of any one or more of Examples 1-3 can optionally be configured such that the delay circuit is configured to apply the configurable delay to the input signal and the sampling circuit is configured to sample the delayed input signal at rising and falling edges of the clock signal, and to provide rising edge sampled data and falling edge sampled data using the sampled, delayed input signal.

In Example 5, the subject matter of any one or more of Examples 1-4 can optionally be configured such that the delay circuit is configured to apply the configurable delay to the clock signal and the sampling circuit is configured to sample the input signal at the rising and falling edges of the delayed clock signal, and to provide rising edge sampled data and falling edge sampled data using the sampled input signal and the delayed clock signal.

In Example 6, the subject matter of any one or more of Examples 1-5 can optionally be configured such that the host input circuit is configured to receive the input signal and the clock signal, and to provide an output signal corresponding to rising and falling edges of the clock signal, the sampling circuit is configured to sample the input signal at rising and falling edges of the clock signal, the host input circuit includes a synchronization circuit configured to synchronize the rising edge sampled data and falling edge sampled data to a selected one of the rising or falling edge of the clock signal and to provide re-sampled rising and falling edge data according to the selected rising edge or falling edge, the selection circuit is configured to selectively align the re-sampled rising and falling edge data according to a selected alignment, and the host input circuit is configured to control the configurable delay of the sampling circuit and the selected alignment of the selection circuit.

In Example 7, the subject matter of any one or more of Examples 1-6 can optionally be configured such that the host input circuit includes a configuration register configured to control the configuration delay of the sampling circuit and the selected alignment of the selection circuit according to the input signal.

In Example 8, the subject matter of any one or more of Examples 1-7 can optionally be configured such that the first edge of the clock signal is a first rising or falling edge of the clock signal and the subsequent, second edge of the clock signal is the rising or falling edge of the clock signal subsequent to the first edge of the clock signal.

In Example 9, the subject matter of any one or more of Examples 1-8 can optionally be configured such that the host input circuit is configured to determine the effective sampling delay for one of the input signal or a clock signal, the host input circuit is configured to select a first edge of the clock signal, to adjust the configurable delay, and to determine a first valid sampling window for the selected first edge of the clock signal using the sampled input signal at a number of configurable delays, the host input circuit is configured to select a second edge of the clock signal, to adjust the configurable delay, and to determine a second valid sampling window for the selected second edge of the clock signal using the sampled input signal at a number of configurable delays, and the host input circuit is configured to select the effective delay for the first and second edges of the clock signal using the first and second valid sampling windows.

In Example 10, subject matter (e.g., a system) can include a host input circuit configured to determine an effective sampling delay for one of an input signal or a clock signal, the host input circuit including: a delay circuit configured to apply a configurable delay to one of the input signal or the clock signal with respect to a selected edge of the clock signal; and a sampling circuit configured to sample the input signal using the clock signal according to the configurable delay; the host input circuit is configured to select a first edge of the clock signal, to adjust the configurable delay, and to determine a first valid sampling window for the selected first edge of the clock signal using the sampled input signal at a number of configurable delays, the host input circuit is configured to select a second edge of the clock signal, to adjust the configurable delay, and to determine a second valid sampling window for the selected second edge of the clock signal using the sampled input signal at a number of configurable delays, and the host input circuit is configured to select a configurable delay for the first and second edges of the clock signal using the first and second valid sampling windows.

In Example 11, the subject matter of any one or more of Examples 1-10 can optionally be configured such that the host input circuit includes a configuration register configured to store the selected configurable delay.

In Example 12, the subject matter of any one or more of Examples 1-11 can optionally be configured such that the host input circuit is configured to align the first and second valid sampling windows, and to select the configurable delay for the first and second edges of the clock signal using a center of the aligned first and second valid sampling windows.

In Example 13, subject matter (e.g., a method) can include applying an effective sampling delay to one of an input signal or a clock signal using a host input circuit, wherein applying the effective sampling delay includes: applying a configurable delay to one of the input signal or the clock signal with respect to a first edge of the clock signal using a delay circuit; sampling the input signal using the clock signal according to the configurable delay using a sampling circuit; and selectively aligning the sampled input signal to a subsequent, second edge of the clock signal using a selection circuit to extend the configurable delay of the host input circuit.

In Example 14, the subject matter of any one or more of Examples 1-13 can optionally be configured such that the configurable delay of the delay circuit has a finite range, and selectively aligning the sampled input signal to the subsequent, second edge of the clock signal includes extending the configurable delay of the host input circuit beyond the finite range of the delay circuit.

In Example 15, the subject matter of any one or more of Examples 1-14 can optionally be configured such that applying the configurable delay includes applying a configurable number of delay taps covering half of a period of the clock signal or less and selectively aligning the sampled input signal to the subsequent, second edge of the clock signal includes selectively aligning the sampled input to the subsequent, second rising or falling edge of the clock signal to extend the configurable delay of the host input circuit beyond the half of the period of the clock signal without increasing the number of the delay taps.

In Example 16, the subject matter of any one or more of Examples 1-15 can optionally be configured such that applying the configurable delay includes applying the configurable delay to the input signal and sampling the input signal includes sampling the delayed input signal at rising and falling edges of the clock signal, and providing rising edge sampled data and falling edge sampled data using the sampled input signal and the clock signal.

In Example 17, the subject matter of any one or more of Examples 1-16 can optionally be configured such that applying the configurable delay includes applying the configurable delay to the clock signal and sampling the input signal includes sampling the input signal at rising and falling edges of the delayed clock signal, and providing rising edge sampled data and falling edge sampled data using the sampled input signal and the delayed clock signal.

In Example 18, the subject matter of any one or more of Examples 1-17 can optionally be configured such that sampling the input signal includes sampling the input signal at rising and falling edges of the clock signal, the method further comprising: synchronizing the sampled rising edge data and the falling edge data to a selected one of the rising or falling edge of the clock signal and providing re-sampled rising and falling edge data according to the selected rising edge or falling edge using a synchronization circuit, selectively aligning the sampled input signal includes selectively aligning the re-sampled rising and falling edge data according to a selected alignment, the method further comprising: controlling the configurable delay of the sampling circuit and the selected alignment of the selection circuit using the host input circuit.

In Example 19, the subject matter of any one or more of Examples 1-18 can optionally be configured such that the first edge of the clock signal is a first rising or falling edge of the clock signal, and the subsequent, second edge of the clock signal is the next rising or falling edge of the clock signal subsequent to the first edge of the clock signal.

In Example 20, the subject matter of any one or more of Examples 1-19 can optionally be configured such that
determining the effective sampling delay for one of the input signal or a clock signal using the host input circuit, comprising: selecting a first edge of the clock signal and, with respect to the selected first edge: adjusting the configurable delay of the delay circuit; sampling the input signal at a number of different configurable delays; and determining a first valid sampling window for the selected first edge of the clock signal using the sampled input signal at the number of different configurable delays, selecting a second edge of the clock signal and, with respect to the selected second edge: adjusting the configurable delay of the delay circuit; sampling the input signal at a number of different configurable delays; and determine a second valid sampling window for the selected second edge of the clock signal using the sampled input signal at the number of different configurable delays, and selecting the effective delay for the first and second edges of the clock signal using the first and second valid sampling windows.

In Example 21, an apparatus can include respective means for performing any of the methods or techniques of Examples 1-20.

In Example 22, subject matter can include a system, apparatus, or device to perform the operations of any of Examples 1-21.

In Example 23, a tangible machine-readable medium can include instructions to perform or implement the operations of any of Examples 1-22.

In Example 24, subject matter can include a method to perform the operations of any of Examples 1-23.

It will be understood that when an element is referred to as being "on," "connected to," or "coupled with" another element, it can be directly on, connected, or coupled with the other element or intervening elements may be present. In contrast, when an element is referred to as being "directly on," "directly connected to," or "directly coupled with" another element, there are no intervening elements or layers present. If two elements are shown in the drawings with a line connecting them, the two elements can be either be coupled, or directly coupled, unless otherwise indicated.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An apparatus comprising:
a delay circuit configured to delay a received signal by an effective delay, the delay circuit having a configurable delay limited to a first range of delay values with respect to a first edge of a clock signal, the first range of delay values limited to a period of the clock signal or less; and
a selection circuit configured to receive an indication that the effective delay is greater than the limited first range of delay values of the configurable delay, and in response, to apply the configurable delay to a subsequent, second edge of the clock signal to extend a range of the effective delay of the delay circuit beyond the first range of delay values of the configurable delay.

2. The apparatus of claim 1, wherein the first range of delay values consists of an aggregate delay time of the period of the clock signal or less.

3. The apparatus of claim 1, wherein the first range of delay values is limited to an aggregate delay time of half the period of the clock signal or less.

4. The apparatus of claim 1, wherein the configurable delay limited to the first range of delay values comprises a limited number of delay taps limited to cover a period of the clock signal or less.

5. The apparatus of claim 4, wherein the limited number of delay taps are limited to cover half a period of the clock signal or less, and
wherein to apply the configurable delay comprises to apply the limited number of delay taps to the subsequent, second edge of the clock signal to extend the range of the effective delay of the delay circuit beyond the first range of delay values without increasing the limited number of the delay taps.

6. The apparatus of claim 1, wherein the first edge of the clock signal is a rising edge, and the subsequent, second edge of the clock signal is the next rising edge of the clock signal.

7. The apparatus of claim 1, wherein the first edge of the clock signal is a rising edge, and the subsequent, second edge of the clock signal is the next falling edge of the clock signal.

8. The apparatus of claim 1, wherein the first edge of the clock signal is a falling edge of the clock signal, and the subsequent, second edge of the clock signal is the next falling edge of the clock signal.

9. The apparatus of claim 1, wherein the first edge of the clock signal is a falling edge, and the subsequent, second edge of the clock signal is the next rising edge of the clock signal.

10. The apparatus of claim 1, comprising a sampling circuit configured to:
sample the received signal at the first and second edges of the clock signal at a number of configurable delay values;
determine valid sampling windows for each of the first and second edges of the clock signal over the number of configurable delay values; and
determine a selected delay value and a selected sampling edge using the determined valid sampling windows for each of the first and second edges of the clock signal,
wherein the selection circuit is configured to apply the selected delay value to the selected sampling edge to align the received signal for sampling, extending the range of the sampling circuit without increasing the first range of delay values.

11. A method comprising:
delaying a received signal by an effective delay using a delay circuit, the delay circuit having a configurable delay limited to a first range of delay values with respect to a first edge of a clock signal, the first range of delay values limited to a period of the clock signal or less;
receiving, using a selection circuit, an indication that the effective delay is greater than the configurable delay; and
in response to receiving the indication that the effective delay is greater than the limited first range of delay values of the configurable delay, applying the configurable delay, using the selection circuit, to a subsequent, second edge of the clock signal to extend a range of the effective delay of the delay circuit beyond the first range of delay values of the configurable delay.

12. The method of claim 11, wherein the first range of delay values consists of an aggregate delay time of the period of the clock signal or less.

13. The method of claim 11, wherein the first range of delay values is limited to an aggregate delay time of half the period of the clock signal or less.

14. The method of claim 11, wherein the configurable delay limited to the first range of delay values comprises a limited number of delay taps limited to cover half a period of the clock signal or less, and
wherein applying the configurable delay comprises applying the limited number of delay taps to the subsequent, second edge of the clock signal to extend the range of the effective delay of the delay circuit beyond the first range of delay values without increasing the limited number of the delay taps.

15. The method of claim 11, wherein the first edge of the clock signal is a rising edge, and the subsequent, second edge of the clock signal is the next rising edge of the clock signal.

16. The method of claim 11, wherein the first edge of the clock signal is a rising edge, and the subsequent, second edge of the clock signal is the next falling edge of the clock signal.

17. The method of claim 11, wherein the first edge of the clock signal is a falling edge of the clock signal, and the subsequent, second edge of the clock signal is the next falling edge of the clock signal.

18. The method of claim 11, wherein the first edge of the clock signal is a falling edge, and the subsequent, second edge of the clock signal is the next rising edge of the clock signal.

19. The method of claim 12, comprising:
sampling the received signal, using a sampling circuit, at the first and second edges of the clock signal at a number of configurable delay values;
determining, using the sampling circuit, valid sampling windows for each of the first and second edges of the clock signal over the number of configurable delay values; and
determining, using the sampling circuit, a selected delay value and a selected sampling edge using the determined valid sampling windows for each of the first and second edges of the clock signal,
wherein applying the configurable delay comprises applying the selected delay value to the selected sampling edge to align the received signal for sampling, extending the range of the sampling circuit without increasing the first range of delay values.

20. An apparatus comprising:
a delay circuit configured to delay a received signal by an effective delay, the delay circuit having a configurable delay limited to a first range of delay values with respect to a first edge of a clock signal, the first range of delay values comprising a limited number of delay taps limited to cover a period of the clock signal or less; and
a selection circuit configured to receive an indication that the effective delay is greater than the limited number of delay taps of the configurable delay, and in response, to apply, using the number of delay taps, the configurable delay to a subsequent, second edge of the clock signal to extend a range of the effective delay of the delay circuit beyond the first range of delay values.

* * * * *